(12) United States Patent
Allen, Jr.

(10) Patent No.: US 8,013,613 B2
(45) Date of Patent: Sep. 6, 2011

(54) VOLTAGE INDICATOR TEST MECHANISM

(75) Inventor: Philip Brown Allen, Jr., Bettendorf, IA (US)

(73) Assignee: Grace Engineered Products, Inc., Davenport, IA (US)

( * ) Notice: Subject to any disclaimer, the term of this patent is extended or adjusted under 35 U.S.C. 154(b) by 378 days.

(21) Appl. No.: 11/608,087

(22) Filed: Dec. 7, 2006

(65) Prior Publication Data
US 2007/0132458 A1    Jun. 14, 2007

Related U.S. Application Data

(60) Provisional application No. 60/748,460, filed on Dec. 8, 2005.

(51) Int. Cl.
     *G01R 31/08* (2006.01)
(52) U.S. Cl. ........................................ 324/523; 324/522
(58) Field of Classification Search .................. 324/523, 324/522
See application file for complete search history.

(56) References Cited

U.S. PATENT DOCUMENTS

| | | | | |
|---|---|---|---|---|
| 3,183,498 A * | 5/1965 | Midis et al. | ............. | 340/644 |
| 3,733,517 A * | 5/1973 | Wilson | ............. | 361/44 |
| 4,713,604 A * | 12/1987 | Becker et al. | ............. | 324/500 |
| 5,291,124 A * | 3/1994 | Hoffman et al. | ............. | 324/72.5 |
| 5,309,311 A * | 5/1994 | Ballada | ............. | 361/48 |
| 5,986,557 A * | 11/1999 | Clarke | ............. | 340/638 |
| 6,278,279 B1 * | 8/2001 | Daun-Lindberg et al. | .... | 324/427 |
| 6,323,652 B1 * | 11/2001 | Collier et al. | ............. | 324/508 |
| 6,492,799 B1 * | 12/2002 | Rajala et al. | ............. | 324/86 |
| 6,563,269 B2 * | 5/2003 | Robinett et al. | ............. | 315/86 |
| 6,700,062 B1 | 3/2004 | Allen, Jr. | | |
| 6,703,938 B1 * | 3/2004 | Clarke | ............. | 340/664 |
| 6,831,226 B2 | 12/2004 | Allen, Jr. | | |
| 6,886,414 B2 * | 5/2005 | Gutierrez et al. | ............. | 73/861.78 |
| 7,256,505 B2 * | 8/2007 | Arms et al. | ............. | 290/1 R |
| 2008/0156406 A1 * | 7/2008 | Breed | ............. | 152/415 |

OTHER PUBLICATIONS

BEHA Full Range Catalog, Greenlee, 1987-88, p. 1-11.*
Greenlee, GT-65, 95 Instruction Manual, Greenlee Company, Dec. 2004, p. 1-16.*

* cited by examiner

*Primary Examiner* — Thomas Valone
(74) *Attorney, Agent, or Firm* — McKee, Voorhees & Sease, P.L.C.

(57) ABSTRACT

An electrical safety monitor includes line inputs for an L1, an L2, an L3, and a GND three-phase connections, a line monitoring circuit having a plurality of light indicators and configured to produce light if voltage exists between any two of the line inputs to thereby indicate presence of voltage to a user, and a current generating circuit electrically connected to the line monitoring circuit and adapted to generate a test current to the line inputs to transition the device from dead to live thereby allowing the user to discern between a failure state of the line monitoring circuit and an off state of the line monitoring circuit. The current inducing circuit can include a magnet which induces the test current, stored energy, a photocell, an electroactive material or other means for generating the test current.

22 Claims, 5 Drawing Sheets

VOLTAGE INDICATOR TEST MECHANISM

CROSS-REFERENCE TO RELATED APPLICATIONS

This application claims priority under 35 U.S.C. §119 of a provisional application Ser. No. 60/748,460 filed Dec. 8, 2005, which application is hereby incorporated by reference in its entirety.

BACKGROUND OF THE INVENTION

The present invention relates to electrical safety, and more particularly to monitoring of AC voltages using voltage indicators. A voltage indicator is generally a low cost device that pre-verifies electrical isolation before maintenance personnel open a control panel and risk exposure to hazardous voltages. Typically mounted to the panel exterior and hardwired into the load side of the main disconnect, this device provides electrical maintenance with an additional safety value. Easy to apply, low cost, quick installation, and inherent reliability makes a voltage indicator a very effective electrical safety device.

Creating and insuring an electrically safe work condition is critical for electricians performing maintenance on de-energized systems. The presence of voltage is the only determining factor if an electrical accident or an arc flash can possibly occur—No voltage, No accident, No arc flash. "Voltage or no voltage" is also the basis of the NFPA 70E's (National Fire Protection Association Standard's for Electrical Safety Requirements for Employee Workplaces) two primary themes: a) establishing an electrically safe work condition, and b) achieving safety while working on energized systems. A voltage warning indicator is like a 'hard wired voltmeter' with the advantage that it needs no power supply or batteries because it is powered from the same 'voltage' that it indicates. A voltage indicator is an additional safety measure between maintenance personnel and hazardous voltage.

U.S. Pat. No. 6,703,938 to Clarke, herein incorporated by reference in its entirety, illustrates one type of electrical safety monitor. Despite the advances of Clarke and other prior art devices, problems remain. The inventor has recognized a problem not addressed by Clarke or other devices in the industry. In particular, there is not a means to reliably provide a zero "OFF" energy state indication. Electricians verify proper operation of their voltmeters with the "Live-Dead-Live" procedure. The first step of this procedure validates the voltmeter to a known voltage (Live) source. Once validated, the electrician uses the voltmeter to verify the electrical system is de-energized (Dead). Lastly, the voltmeter needs to be validated again to a known (Live) source to insure the voltmeter is still fully functional. The design of Clark transitions well from a live state to a dead state. However, once it is in the dead state it cannot provide a positive indication of zero energy. In other words, if the user disconnects the power from the electrical system, one cannot discern between failure and an off state of the voltage indicator. A test feature on the voltage indicator allows the electrician a means to inject a test current into the circuit, which temporarily re-energizes the circuit to insure it is still fully functional. This feature allows the device to transition from dead to live thereby meeting the requirements of the "Live-Dead-Live" procedure.

BRIEF SUMMARY OF THE INVENTION

Therefore, it is a primary object, feature, or advantage of the present invention to improve over the state of the art.

It is a further object, feature, or advantage of the present invention to provide a voltage indicator to improve safety.

It is a further object, feature, or advantage of the present invention to reliably provide a zero "OFF" energy state indication.

It is a further object, feature, or advantage of the present invention to provide a test feature so that an operator can discern between a zero state and a failure state.

One or more of these and/or other objects, features, or advantages of the present invention will become apparent from the specification and claims that follow.

The inventor has recognized the problem of needing to discern between a failure state and an off state. The present invention provides for a test feature that allows an electrician or other to see a device transition from non-energized (Dead) to energized (Live).

According to one aspect of the present invention an electrical safety monitor is provided. The electrical safety monitor includes line inputs for an L1, an L2, an L3, and a GND three-phase connections, a line monitoring circuit having a plurality of light indicators and configured to produce light if voltage exists between any two of the line inputs to thereby indicate presence of voltage to a user, and a current generating circuit electrically connected to the line monitoring circuit and adapted to generate a test current to the line inputs to transition the device from dead to live, thereby allowing the user to discern between a failure state of the line monitoring circuit and an off state of the line monitoring circuit. The current generating circuit may include a magnet and the current generating circuit may be adapted to induce the test current in response to movement of the magnet, either linear movement or rotational movement. The current generating circuit may include an electroactive material adapted for transducing mechanical movement into the test current, such as a piezoelectric element. The current generating circuit may include a stored charge circuit adapted for injecting the test current in response to activation of a switch. The current generating circuit may include a photocell adapted for generating the test current. The current generating circuit may include a spring loaded crank adapted for generating the test current.

According to another aspect of the present invention, an improvement to an electrical safety monitor having a line monitoring circuit for monitoring L1, L2, L3, and GND three-phase line connections and a plurality of indicators for communicating presence of voltage between any of the line connections is provided. The improvement includes a current inducing circuit electrically connected to the line monitoring circuit and adapted for generating a test current upon activation by a user to transition the line monitoring circuit from dead to live thereby allowing the user to discern between a failure state of the line monitoring circuit and an off state for the line monitoring circuit.

According to another aspect of the present invention, a method for providing electrical safety monitoring is provided. The method includes providing an electrical safety monitor having a plurality of solid-state light emitting diodes configured to indicate presence of voltage and generating a test current to transition the electrical safety monitor from a dead state to a live state to thereby allow a user to discern between a failure state and an off state.

DETAILED DESCRIPTION OF THE PREFERRED EMBODIMENT

The present invention provides for injecting a test current into a circuit so that an electrician can see the device transition from dead to live. Observing this transition allows an electrician or other operator to know that the device is in the off state. Without seeing the transition, the operator would not necessarily know whether the device was truly in an off state or whether the device was in a dead state.

Figure 1:
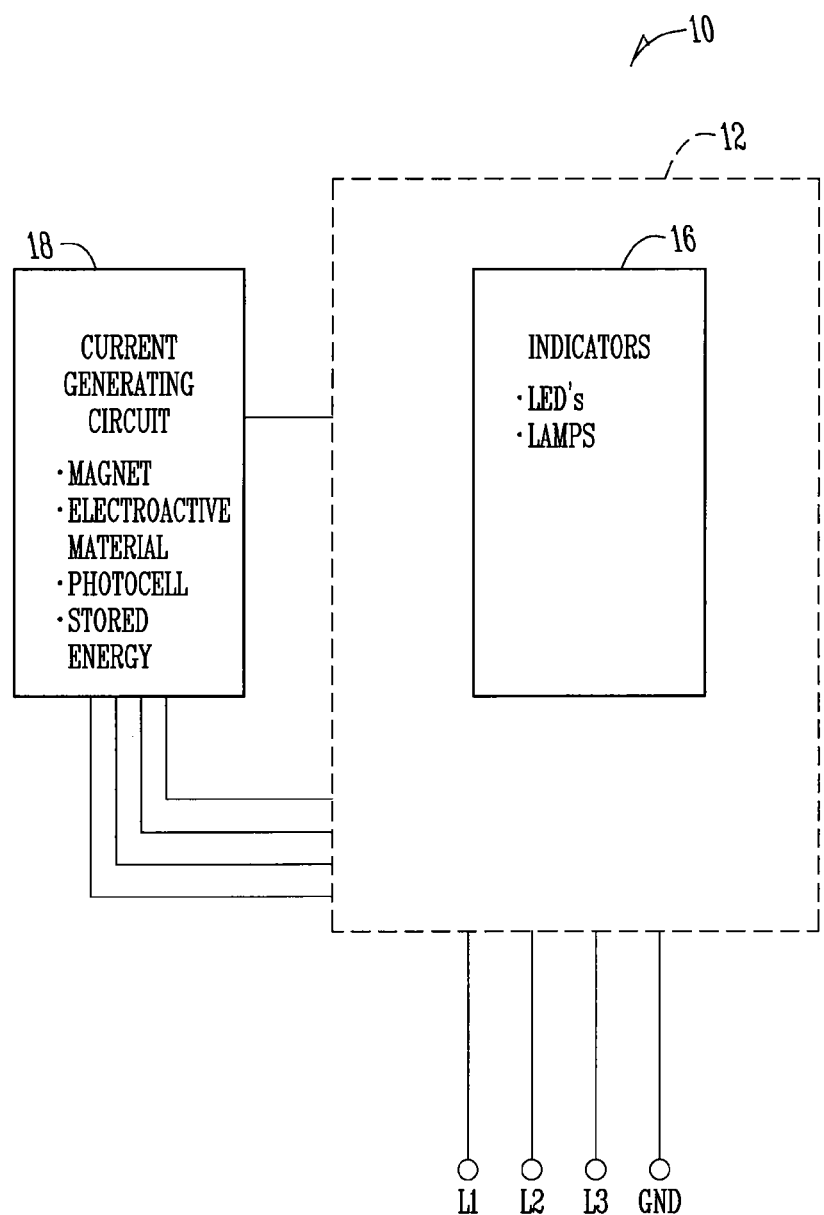
FIG. 1 illustrates one embodiment of the present invention.

FIG. 1 provides a block diagram of one embodiment of the present invention. In FIG. 1 a device 10 is shown. The device 10 includes a line monitor device 12 having indicators 16 such as light emitting diodes (LEDs) or lamps. A current generating circuit 18 is in electrical communication with the line monitoring device 12. The current generating circuit 18 may include a magnet, an electroactive material such as a piezoelectric element, a photocell, a circuit which stores energy, a spring loaded crank, or other element or configuration which is adapted for injecting a test current into the line monitoring device 12. The injection of a test current into line monitoring device 12 allows an electrician or other operator to observe the transition from a dead state to a live state.

Figure 2:
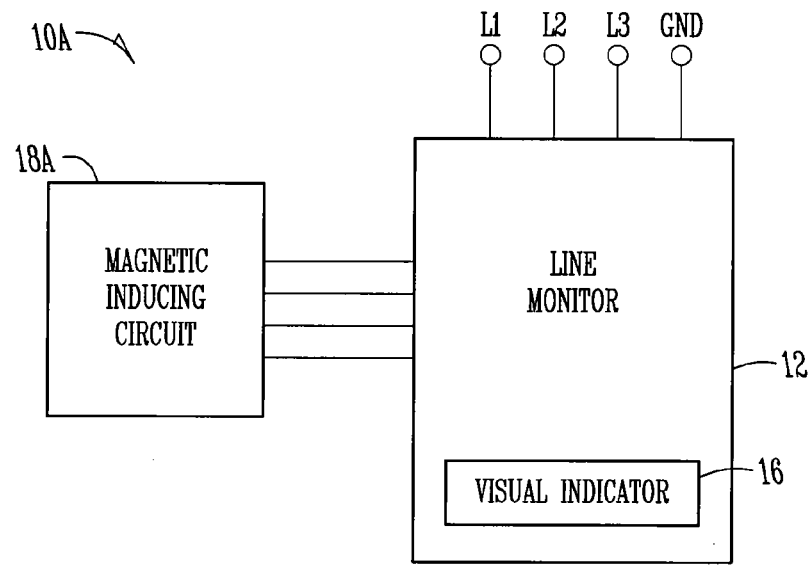
FIG. 2 illustrates one embodiment of the present invention where magnetic induction is used to inject a test current.

FIG. 2 illustrates one embodiment where the electrical safety monitor 10A includes a magnetic inducing circuit 18A. Rotational or linear movement may be applied to a magnet in order to induce a current which is applied to the line monitor 12. The line monitor 12 includes a visual indicator 16 which may, for example, include multiple solid state light emitting diodes.

Figure 3:
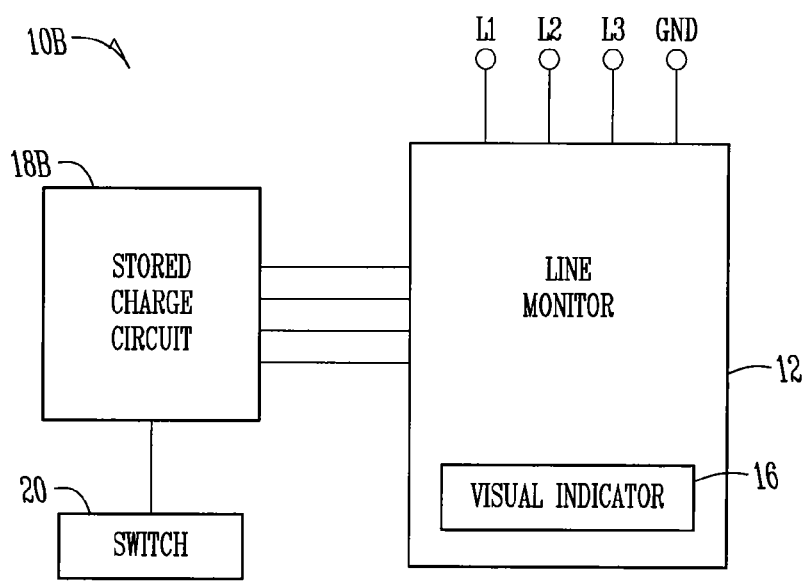
FIG. 3 illustrates one embodiment of the present invention where stored charge is used to inject a test current.

FIG. 3 illustrates one embodiment where the electrical safety monitor 10B includes a stored charge circuit 18B. A switch 20 such as, but not limited to, a pushbutton may be used to inject a test current from the stored charge circuit to the line monitor 12. The stored charge circuit may, for example, include one or more capacitors (not shown) to store charge.

Figure 4:
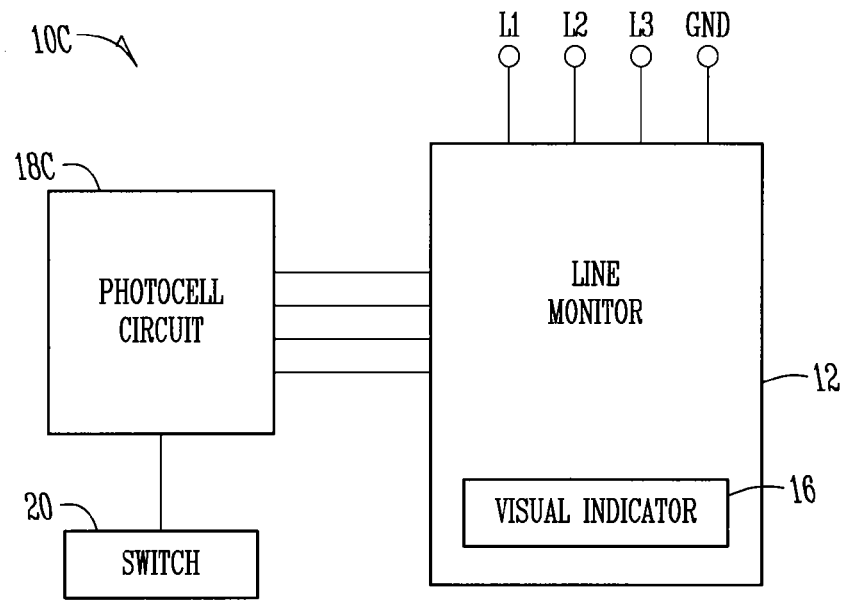
FIG. 4 illustrates one embodiment of the present invention where a photocell circuit is used to store and inject a test current.

FIG. 4 illustrates one embodiment where the electrical safety monitor 10C includes a photocell circuit 18 and a switch electrically connected to the photocell circuit 18C. The photocell circuit 18C is used to generate and store energy to provide a test current which, when the switch 20 is pressed, will be injected into the line monitor 12.

Figure 5:
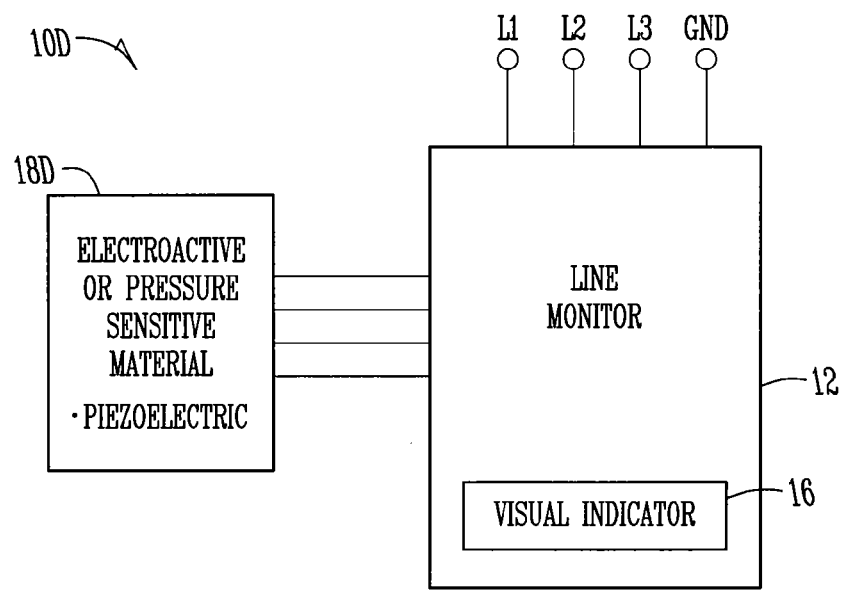
FIG. 5 illustrates one embodiment of the present invention where electroactive or pressure sensitive material is used to inject a test current.

FIG. 5 illustrates one embodiment where the electrical safety monitor 10F includes an electroactive or pressure sensitive material 18D. The electroactive or pressure sensitive material 18D is deformed to generate a test current which is injected into the line monitor 12.

Figure 6:
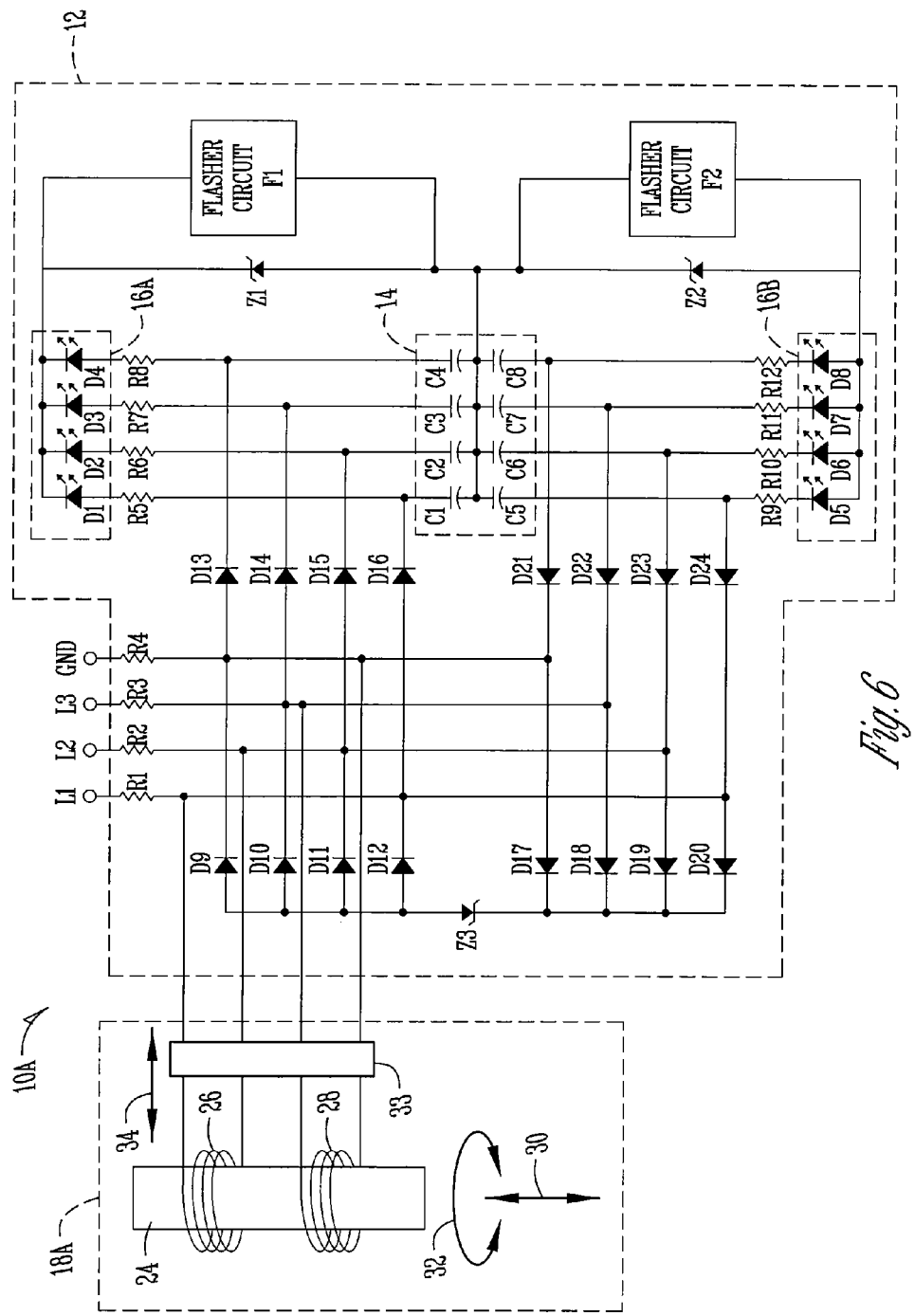
FIG. 6 illustrates one embodiment of the present invention where a magnet is used to induce a current to inject into a line monitoring device.
Figure 7:
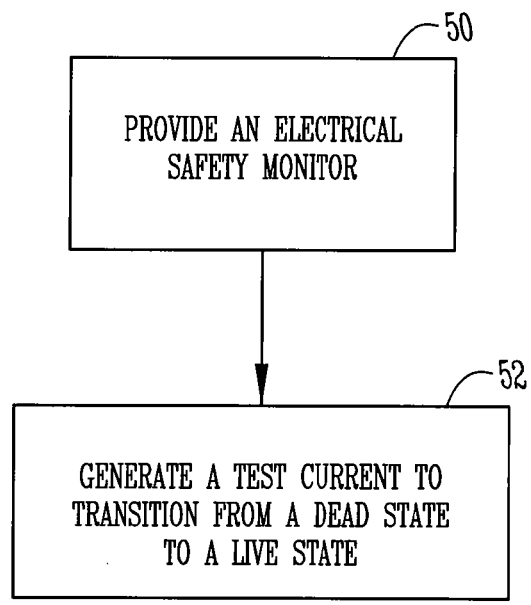
FIG. 7 illustrates one embodiment of methodology of the present invention.

FIG. 6 illustrates one embodiment where the line monitor 12 used is based on that disclosed in U.S. Pat. No. 6,703,938 to Clarke, herein incorporated by reference in its entirety. The electrical safety monitor 10A uses a magnetic inducing circuit 18A to induce a test current into the line monitor 12. Line inputs are shown for lines L1, L2, L3, and the ground potential GND, each of which are connected to a power limiting resistor, R1, R2, R3, and R4, respectively. The line inputs are associated with three-phase power connections. The safety monitoring devices monitors the lines L1, L2, L3, and GND for presence of electrical energy.

Each LED D1, D2, D3, D4, D5, D6, D7, D8 produces light to indicate current flow in its path. There are current limiting resistors R5, R6, R7, R8, R9, R10, R11, and R12, associated with the LEDs. For each LED D1, D2, D3, D4, D5, D6, D7, D8 there is a corresponding capacitance C1, C2, C3, C4, C5, C6, C7, C8. Zener diodes Z1, Z2 are used for limiting voltage. Zener diode Z3 also serves as a protective element to limit voltage over the capacitances C1, C2, C3, C4, C5, C6, C7, C8. Diodes D9, D10, D11, D12, D17, D18, D19, are blocking diodes also used as protective elements. Diodes D13, D14, D15, D16, D21, D22, D23, D24 are used as rectifying diodes. Discharge or flasher circuits F1, F2 are used so that stored energy in the capacitances is discharged through the corresponding light emitting diodes.

Indicators 16A are configured to draw current from positively charged lines and to produce light indicative of positive voltage potential between these lines and other lines. Indicators 16B are configured to draw current from negatively charged lines and to produce light indicative of negative voltage potential between these lines and other lines.

Thus, the line monitor 12 can be used to identify the presence of AC or DC voltages across any of the line inputs and grounds. The design of the circuit of the line monitor 12 also includes some redundancy. However, consider the case where there are no indicator lights present. The absence of indicator lights may mean that there are no voltages present and thus a safe state exists. Unfortunately, the absence of indicator lights could also mean that the line monitor 12 has simply failed and there is voltage present.

The magnetic current inducing circuit 18A allows a test current to be introduced, which once induced will be detected by the circuit 12 and an appropriate indicator lights will be temporarily lit if the circuit 12 is functioning properly. If the circuit 12 has failed, then no indicator light will be lit and the operator will know that the circuit 12 has failed and that there may be voltage present. In other words, the current inducing circuit 18 allows an electrician or other operator to watch the transition of the circuit from live to dead.

The addition of the magnetic current inducing circuit 18A allows a test current to be induced by movement of a magnet 24 with respect to coils 26 and 28. The movement may be linear movement as indicated by arrow 30 or rotational movement as indicated by arrow 32. The coils 26, 28 are electrically connected through test current injection circuit 33 thus resulting in activation of corresponding LEDs. The estimated current per phase is between approximately 100 and 300 microamps. Of course, the current can vary based on the circuit design and components used.

FIG. 3 illustrates one embodiment of the methodology of the present invention. In step 50, an electrical safety monitor is provided. In step 52, a test current is generated to transition the electrical safety monitor from a dead state to a live state so that an electrician or other operator can distinguish between a dead state and a failure state of the electrical safety monitor.

The present invention contemplates numerous variations in the construction of the present invention. There could, for example, be a single generator with multiplexed outputs or separate generators. The circuit of the present invention can be incorporated into different types of devices, including devices using different circuits and having different types of housing. These and other variations and alternatives in design and methodology are within the spirit and scope of the claimed invention.

What is claimed is:

1. An electrical safety monitor, comprising:
   line inputs for hardwiring an L1, an L2, an L3, and a GND three-phase connections;
   a line monitoring circuit having a plurality of light indicators and configured to produce light if voltage exists between any two of the line inputs to thereby indicate presence of voltage to a user;
   a current generating circuit electrically connected to the line monitoring circuit and adapted to generate a test current to the line inputs to transition the electrical safety monitor from dead to live thereby allowing the user to discern between a failure state of the line monitoring circuit and an off state between line inputs.

2. The electrical safety monitor of claim 1 wherein the current generating circuit includes a magnet and the current generating circuit is adapted to induce the test current in response to movement of the magnet.

3. The electrical safety monitor of claim 2 wherein the movement is linear movement.

4. The electrical safety monitor of claim 2 wherein the movement is rotational movement.

5. The electrical safety monitor of claim 1 wherein the current generating circuit includes an electroactive material adapted for transducing mechanical movement into the test current.

6. The electrical safety monitor of claim 5 wherein the electroactive material comprises a piezoelectric element.

7. The electrical safety monitor of claim 1 wherein the current generating circuit includes stored charge circuit adapted for injecting the test current in response to activation of a switch.

8. The electrical safety monitor of claim 1 wherein the current generating circuit includes a photocell adapted for generating the test current.

9. The electrical safety monitor of claim 1 wherein the current generating circuit includes a crank adapted for generating the test current.

10. An improvement to an electrical safety monitor having a line monitoring circuit for monitoring hardwired L1, L2, L3, and GND three-phase line connections and a plurality of indicators for communicating presence of voltage between any of the line connections, the improvement comprising a current inducing circuit electrically connected to the line monitoring circuit and adapted for generating a test current upon activation by a user to transition the line monitoring circuit from dead to live thereby allowing the user to discern between a failure state of the line monitoring circuit and an off state between line inputs.

11. The electrical safety monitor of claim 10 wherein the current generating circuit includes a magnet and the current generating circuit is adapted to induce the test current in response to movement of the magnet.

12. The electrical safety monitor of claim 11 wherein the movement is linear movement.

13. The electrical safety monitor of claim 11 wherein the movement is rotational movement.

14. The electrical safety monitor of claim 10 wherein the current generating circuit includes an electroactive material adapted for transducing mechanical movement into the test current.

15. The electrical safety monitor of claim 14 wherein the electroactive material comprises a piezoelectric element.

16. The electrical safety monitor of claim 10 wherein the current generating circuit includes stored charge circuit adapted for injecting the test current in response to activation of a switch.

17. The electrical safety monitor of claim 10 wherein the current generating circuit includes a photocell adapted for generating the test current.

18. The electrical safety monitor of claim 10 wherein the current generating circuit includes a crank adapted for generating the test current.

19. A method for providing electrical safety monitoring, comprising:
   providing an electrical safety monitor having a plurality of solid-state light emitting diodes configured to indicate presence of voltage;
   hardwiring the electrical safety monitor to an L1, an L2, an L3, and a GND three-phase connections;
   generating a test current to transition the electrical safety monitor from a dead state to a live state to thereby allow a user to discern between a failure state of the electrical safety monitor and an off state between the three-phase connections.

20. The method of claim 19 wherein the step of generating a test current is performed by magnetically inducing the test current.

21. The method of claim 19 wherein the step of generating a test current is performed by converting mechanical movement into the test current.

22. The method of claim 19 wherein the step of generating a test current is performed using stored energy.

* * * * *